United States Patent [19]

Molee

[11] Patent Number: 4,556,437
[45] Date of Patent: Dec. 3, 1985

[54] METHOD OF DIFFUSING SILICON SLICES WITH DOPING MATERIALS

[75] Inventor: Casper S. Molee, Bloomfield, N.J.

[73] Assignee: Victory Engineering Corporation, Springfield, N.J.

[21] Appl. No.: 631,624

[22] Filed: Jul. 16, 1984

[51] Int. Cl.[4] .......................................... H01L 21/223
[52] U.S. Cl. .................................. 148/188; 148/189; 148/190
[58] Field of Search ........................ 148/188, 190, 189

[56] References Cited

U.S. PATENT DOCUMENTS

| | | | |
|---|---|---|---|
| 2,804,405 | 8/1957 | Derick et al. | 148/1.5 |
| 3,183,130 | 5/1965 | Reynolds et al. | 148/188 |
| 3,615,944 | 10/1971 | Sheng et al. | 148/189 |
| 3,852,128 | 12/1974 | Kreuzer | 148/189 |
| 3,956,036 | 5/1976 | Molee | 148/188 |
| 3,972,838 | 8/1976 | Yamashita et al. | 148/189 X |

Primary Examiner—George T. Ozaki
Attorney, Agent, or Firm—Albert F. Kronman

[57] ABSTRACT

A method of diffusing dopant material into the crystal surfaces of silicon crystal slices which comprises placing the dopant material in the form of wafers between the adjacent major faces of each of a stack of silicon crystal slices, clamping said slices and wafers together as an assembly within a refractory boat so that the crystal slices are in substantially parallel vertical disposition with their entire facing surfaces covered by dopant material and thereafter introducing the boat and the assembly into a zone of high temperature wherein the dopant material is simultaneously diffused into the major faces of the silicon crystal slices. Other arrangements of silicon crystal slices and dopant wafers of the same or different materials can produce slices diffused on both sides with the same dopant or with a different dopant material on each side.

11 Claims, 6 Drawing Figures

METHOD OF DIFFUSING SILICON SLICES WITH DOPING MATERIALS

BACKGROUND OF THE INVENTION

This invention relates generally to an improved method of diffusing dopants into the surfaces of a plurality of silicon slices to control the electrical characteristics of the silicon for subsequent passage of current.

Doping of silicon crystal slices is old in the art and may types of furnaces and methods have been used to diffuse the dopant material into the crystal surface. Generally, the slices were first coated with a solution or mixture containing the dopant material. The slices were then spread on a tray and placed in a furnace where they were subjected to a heating, cooling cycle involving many hours at a high temperature. Such a procedure creates several problems, such as; (1) warping of slices because of changes in thermal conditions, (2) autodoping between silicon slices, and (3) the proper maintenance of surface concentration of dopant material. Also, only a few slices can be accommodated on each furnace tray, thereby severely limiting the number of slices per furnace cycle.

Among patents of interest in this field are U.S. Pat. Nos. 2,804,405; 3,183,130 and 3,615,944. The first of these describes a method for making a semiconductor device by the steps of exposing for at least several minutes a semiconductive silicon body to an atmosphere rich in phosphorous in one of its oxidation states to form a non-porous phosphorous film on the surface of the body, removing the phosphorous film from selected portions of the surface of the body, exposing the silicon body to an atmosphere rich in boron in one of its oxidation states to form a boron film on selected portions of the surface of the body and heating the body for diffusing the phosphorous and boron films into the body and forming phosphorous-diffused and boron-diffused layers on the body.

U.S. Pat. No. 3,183,130 describes a process for treating a plurality of semiconductor wafers to diffuse an acceptor doping impurity into one side of each wafer and to diffuse a donor doping impurity into the other side of each wafer by forming first and second impurity bearing layers respectively on first and second sides of each wafer with the first layer containing the acceptor doping impurity on the first side and the second layer containing the donor doping impurity on the second side such that the layers are adapted to serve as sources of impurities in a diffusion step, placing the wafers in a diffusion tube and arranging them in a stack extending longitudinally of the tube, with each pair of adjacent wafers in the stack thereof having the layers which contain the same impurity material in contact with each other, passing a flushing gas through a restricted flow path in the tube which adjoins and extends about the edges of the wafers while subjecting the wafers to heat in the tube so as to diffuse said impurities from said layers into the wafers with the flushing gas acting to sweep impurity vapors away from the edges of the wafers.

U.S. Pat. No. 3,615,944 teaches a method for continuously doping semiconductor materials wherein these materials are placed in separate chambers which are sequentially exposed to preheating, doping and cooling.

The present invention is related to U.S. Pat. No. 3,956,036 issued on May 11, 1976, which discloses a method of diffusing a boron dopant into silicon slices by applying a dopant solution to the faces of each slice, packing a plurality of slices adjoining each other in a quartz boat and inserting the boat slowly into a tubular furnace. In the method of the patent, the boron surface of each slice is covered with alumina powder to eliminate sticking.

OBJECTS AND FEATURES OF THE INVENTION

A broad object of this invention is to provide a simplified and high yield method of diffusing the major surfaces of a plurality of silicon slices with dopant.

Another object of the invention is to so arrange silicon slices within a refractory boat as to avoid autodoping from slice to slice.

A further object of the invention is to provide a method of doping silicon which does not require the use of an inert atmosphere.

Still another object of the present invention is to achieve uniform doping of silicon discs right out to the peripheries thereof.

A feature of the present invention is the use of solid dopant wafers as the source of the doping material.

Another feature is the use of an assembly of disc shaped silicon crystal slices in face to face disposition with the dopant therebetween clamped together so that they are vertically carried within a refractory boat.

Still another feature of the invention is to provide wafers of dopant having a uniformity of dopant material throughout.

SUMMARY OF THE INVENTION

In a preferred method of the present invention a plurality of disc shaped single crystal silicon slices, having major outer faces substantially parallel to each other, are arranged as a stack with a wafer of dopant material disposed parallel to and overlying said adjacent faces of said slices. The assembly is then clamped together to prevent warping during the subsequent heating and cooling steps. The silicon slices are placed within a boat so that the slices are normally positioned (on their edges) with respect to the bottom of the boat. Thereafter, the boat and the clamped assembly of slices and wafers are slowly advanced into an oven wherein the dopant is diffused into the crystal major faces on each side of the wafers. The boat is then slowly withdrawn from the oven and the assembly cooled.

BRIEF DESCRIPTION OF THE DRAWING

In the accompanying drawing forming part hereof, similar parts have been given the same reference numerals, in which drawing.

DETAILED DESCRIPTION OF THE INVENTION

Figure 1:
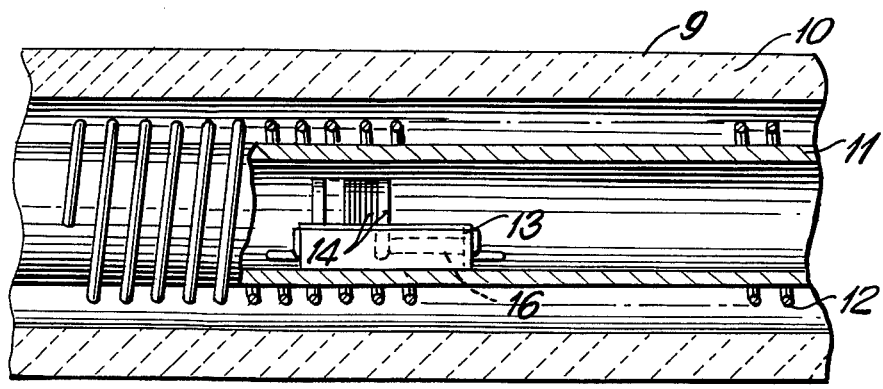
FIG. 1 is a longitudinal view partly in section of a tubular furnace with a boat, silicon slices and dopant wafers therein.
Figure 2:
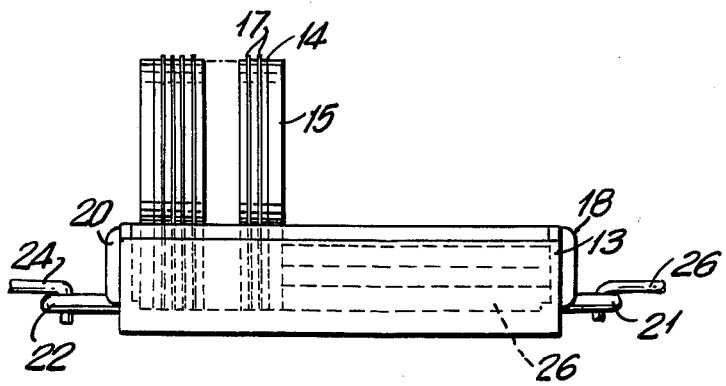
FIG. 2 is a side view, drawn to an enlarged scale, of the boat, slices and dopant wafers shown in FIG. 1.

Referring to the drawing, FIG. 1 shows a portion of a diffusion furnace assembly 9 open to air, having a tubular heat shield 10. Inside the shield is a tubular furnace wall 11 made of Mullite, an orthorhombic silicate of aluminum and available commercially from the Carborundum Co. of Niagara Falls, N.Y. The Mullite is selected over quartz because of its greater stability at the preferred high temperature used (1350° C.) in the diffusion process. A heating coil of resistance wire 12 is wound around the Mullite wall 11 and connected to a conventional electrical power source (not shown) for applying current to the coil. The coil is capable of maintaining the temperature within the wall 11 at a constant temperature of 1350° C. Suitable temperature regulating means (not shown), well-known in the art, are used to maintain the predetermined temperature at a value plus or minus 1°.

Figure 5:
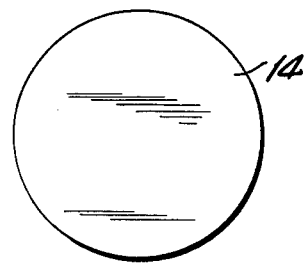
FIG. 5 is a plan view of a silicon slice.
Figure 6:
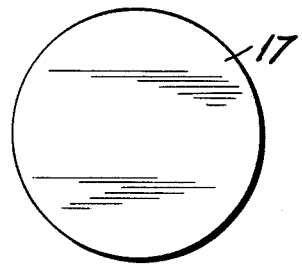
FIG. 6 is a plan view of a dopant wafer.

Within the furnace wall 11, there is shown a refractory boat 13 of quartz carrying a plurality of silicon crystal slices 14 (best shown in FIG. 5) and dopant wafers 17 (shown in FIG. 6). The silicon slices 14 and dopant wafers 17 are stacked between two slabs 15 of fire brick to maintain the slices in a flat configuration during the heating and cooling periods to prevent warping. Three quartz rods 16 are used to hold the slabs 15 and the stack under moderate clamping pressure. The rods 16 are placed on the bottom of the boat's interior, between one end of the boat 13 and the side of one of the fire bricks such that the stack can be disposed at an angle of 90° to 100° relative to the horizontal base of the boat.

The quartz boat 13 is provided with re-enforced end walls 18, 20 and two curved handles 21, 22. The handles are used to insert and withdraw the boat from the furnace by means of a quartz push rod 24 and an automatic boat puller 26 of known design (not shown), to provide for automatic movement of the boat relative to said furnace. Either the rod 24 or the puller 26 is actuated by a well-known screw mechanism for this purpose.

OPERATION

Where it is desired to dope only one face of the silicon slices, the slices 17 are disposed in the stack in pairs. Each pair carries a disc of dopant material 17 therebetween as best shown in FIG. 3.

Figure 3:
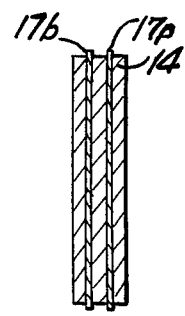
FIG. 3 is a side view of three silicon crystal slices showing dopant wafers between the slices.
Figure 4:
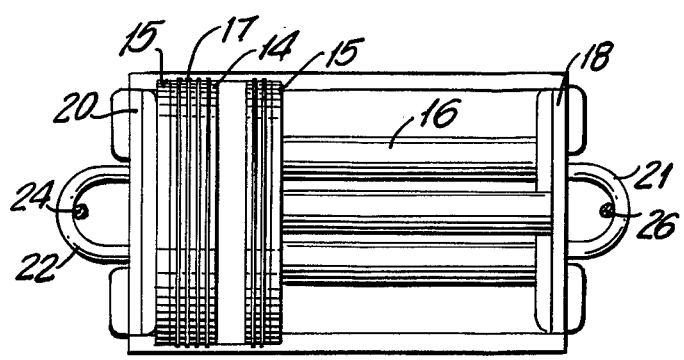
FIG. 4 is a top view of the boat, slices and dopant wafers of FIG. 3.

It is possible according to the present invention to also dope the opposite face of the silicon slices with a second dopant, such as boron, at the same time by slipping a solid wafer 17b of boron between adjacent pairs of slices as shown in FIG. 3.

The silica slices are preferably stacked as shown in FIG. 3 with a dopant wafer 17p, such as phosphorus, whose resistivity is 0.10–0.15 OHMS and an alternating boron wafer 17b whose resistivity is 0.08–0.10 OHMS, such that one side of two wafers in a pair is in contact with the phosphorus dopant and the opposite side is in contact with the boron wafer. It is possible to stack two hundred slices within the boat in this manner. The dopant wafers may be the same diameter as the silicon slices. However, it is preferred that the edge of the wafers extend over the edge of the silicon slices by as much as 0.025 inches to obtain edge-to-edge doping and to prevent migration of dopant material from slice to slice (auto-doping). If the slices are allowed to separate, warpage and autodoping from slice to slice may occur.

At the start of the diffusion cycle, the carrier boat with the slices is placed at the entrance of the diffusion furnace 9 and attached to the pusher quartz rod 24 and boat puller 26. The boat and stack of slices is then automatically pushed into the diffusion zone having a temperature of the order of 1350° C. at the rate of one-half inch (12.7 mm) per minute. Unexpectedly, this slow rate has been found to be satisfactory; allows for proper out-gassing of the dopant wafer, and eliminates slice warpage which would occur at faster speeds. After entering the hot diffusion zone, the boat and slices remain in the zone about $5\frac{1}{2}$ to about $6\frac{1}{2}$ hours, preferably for six hours, and are then automatically withdrawn at one-half inch (12.7 mm) per minute until the entrance is reached again. The boat and slices are left at the entrance position for ten minutes prior to removing them to the room environment.

Depending on the particular nature of the dopant material, the diffusion temperature in the diffusion zone of the furnace can range from 1325° to 1350° C. The boat and stack of slices and wafers can be moved into and out of the furnace at a rate of the order of one-half inch (12.7 mm) per minute. The rates of introduction and withdrawal need not be the same and can be set by means of mechanisms connected to rod 24 and/or puller 26.

From the above description of the apparatus and the operation of doping, it will be evident that the invention provides a procedure wherein: (1) a large number of silicon slices can be automatically doped with one or two different dopants in a short time cycle; (2) no special atmosphere is required within the furnace or carrier boat which can be open to air; (3) no special evaporating atmosphere is required to present the dopant to the silicon slices; (4) there is no autodoping from one slice to another; (5) there is no warpage of slices; (6) the surface concentration of the dopant material is uniform over the full silicon wafer face so that the resultant devices possess uniform electrical characteristics.

It will be obvious to those skilled in the art that various modifications may be made in the method illustratively described herein without departing from the spirit or scope of the invention as expressed in the following claims.

I claim:

1. The method of diffusing dopant material into the major surfaces of silicon crystal slices comprising the steps of:
   (a) disposing a plurality of silicon crystal slices with their major faces in substantial parallelism;
   (b) placing a solid wafer of dopant material between at least two adjacent major faces of the said crystal slices so as to substantially overlie the said major faces;
   (c) placing the aforesaid silicon crystal slices and dopant material together as an assembly within a boat in the presence of ambient air;
   (d) clamping the said assembly together to provide a firm side-by-side contact between the silicon crystal slices and the dopant wafers;
   (e) advancing the boat containing the assembly into a furnace, open to air, at an elevated temperature;
   (f) maintaining the assembly within the heating zone of the furnace at said elevated temperature until the dopant has diffused into the major surfaces of the silicon crystal slices; and
   (g) slowly withdrawing the boat together with its assembly of silicon crystal slices from said furnace.

2. The process according to claim 1 in which the solid wafer dopant is of an area at least equal to that of the area of the major faces of each of the silicon crystal slices and of the same shape.

3. The process according to claim 1 in which the dopant wafers are larger in area than the major faces of the silicon crystal slices.

4. The process according to claim 1 in which the silicon crystal slices are arranged in pairs throughout the assembly and a wafer of dopant material is placed between each of said pairs.

5. The process according to claim 1 in which the solid wafer dopant placed on opposite major faces of the silicon crystal slices are of different dopant materials.

6. The process according to claim 1 in which the silicon crystal slices are disposed within the boat at an angle of from 90° to 100° with respect to the horizontal.

7. The process according to claim 1 in which the dopant is phosphorus and the temperature within the furnace is of the order of 1325° to 1350° C.

8. The process according to claim 5 in which the dopant on one face of the silicon crystal is a wafer of phosphorus and the dopant on the opposite face is a wafer of boron.

9. The process according to claim 7 in which the boat is advanced into the furnace at the rate 12.7 mm per minute.

10. The process according to claim 9 in which the boat and slices remain within the diffusing zone of the furnace for about $5\frac{1}{2}$ to about $6\frac{1}{2}$ hours.

11. The process according to claim 10 in which the boat and silicon slices, following the heating step, are withdrawn from the furnace at the rate 12.7 mm per minute.

* * * * *